US 9,051,446 B2

(12) United States Patent
Kobayashi et al.

(10) Patent No.: US 9,051,446 B2
(45) Date of Patent: Jun. 9, 2015

(54) CONDUCTIVE CROSSLINKED BODY AND PRODUCTION PROCESS THEREOF, AND TRANSDUCER, FLEXIBLE WIRING BOARD AND ELECTROMAGNETIC WAVE SHIELD USING THE CONDUCTIVE CROSSLINKED BODY

(75) Inventors: Jun Kobayashi, Komaki (JP); Hitoshi Yoshikawa, Komaki (JP); Wataru Takahashi, Komaki (JP)

(73) Assignee: SUMITOMO RIKO COMPANY LIMITED, Komaki (JP)

( * ) Notice: Subject to any disclaimer, the term of this patent is extended or adjusted under 35 U.S.C. 154(b) by 639 days.

(21) Appl. No.: 13/390,615

(22) PCT Filed: Feb. 22, 2011

(86) PCT No.: PCT/JP2011/053812
§ 371 (c)(1),
(2), (4) Date: Feb. 15, 2012

(87) PCT Pub. No.: WO2011/118315
PCT Pub. Date: Sep. 29, 2011

(65) Prior Publication Data
US 2012/0146464 A1    Jun. 14, 2012

(30) Foreign Application Priority Data

Mar. 23, 2010   (JP) ................................ 2010-065805

(51) Int. Cl.
*H02N 11/00* (2006.01)
*H01L 41/09* (2006.01)
(Continued)

(52) U.S. Cl.
CPC ............... *C08K 5/057* (2013.01); *C08K 3/0033* (2013.01); *C08K 5/0091* (2013.01); *C08K 5/098* (2013.01);
(Continued)

(58) Field of Classification Search
USPC ................................................. 310/300, 800
See application file for complete search history.

(56) References Cited

U.S. PATENT DOCUMENTS 3,726,841 A * 4/1973 Mirolli et al. .................. 525/403
3,757,088 A * 9/1973 Osborn .......................... 219/553
(Continued)

FOREIGN PATENT DOCUMENTS

CN    1775862 A    5/2006
EP    1901311 A1   3/2008
(Continued)

OTHER PUBLICATIONS

International Preliminary Report on Patentability (Form PCT/IB/338) (1 page) of International Application No. PCT/JP2011/053812 mailed Nov. 1, 2012 with Forms PCT/IB/373 (1 page) and PCT/ISA/237 (5 pages).
(Continued)

*Primary Examiner* — Thomas Dougherty
(74) *Attorney, Agent, or Firm* — Westerman, Hattori, Daniels & Adrian, LLP

(57) ABSTRACT

The present invention provides a flexible conductive crosslinked body excellent in durability having a small influence of a reaction residue after the crosslinking on an object to which the conductive crosslinked body adheres, and a production process of the flexible conductive crosslinked body. The conductive crosslinked body is synthesized from a conductive composition containing a rubber polymer, an organic metal compound, and a conducting agent and has a crosslinked structure. The production process of the conductive crosslinked body includes: a mixed solution preparing step for preparing a mixed solution in which the rubber polymer, the conducting agent, and the organic metal compound are mixed in a solvent capable of dissolving the rubber polymer and capable of chelating the organic metal compound; and a crosslinking step for removing the solvent from the mixed solution to allow a crosslinking reaction to proceed. The conductive crosslinked body is suitable as an electrode or a wire for a transducer, a wire for a flexible wiring board, and an electromagnetic wave shield.

9 Claims, 7 Drawing Sheets

(51) Int. Cl.
*C08K 5/057* (2006.01)
*C08K 3/00* (2006.01)
*C08K 5/00* (2006.01)
*C08K 5/098* (2006.01)
*H05K 1/09* (2006.01)
*H01L 41/193* (2006.01)
*H05K 1/16* (2006.01)

(52) U.S. Cl.
CPC .......... *C08K 2201/001* (2013.01); *H05K 1/095* (2013.01); *H05K 1/162* (2013.01); *H01L 41/09* (2013.01); *H01L 41/193* (2013.01)

(56) References Cited

U.S. PATENT DOCUMENTS

| | | | |
|---|---|---|---|
| 4,438,039 | A | 3/1984 | Beers et al. |
| 4,675,346 | A | 6/1987 | Lin et al. |
| 4,722,967 | A | 2/1988 | Beers et al. |
| 2008/0207809 | A1 | 8/2008 | Koide |
| 2008/0227913 | A1 | 9/2008 | Koide |
| 2011/0300393 | A1* | 12/2011 | Iio et al. ............ 428/521 |
| 2013/0056249 | A1* | 3/2013 | Taguchi et al. ........ 174/254 |

FOREIGN PATENT DOCUMENTS

| | | | | |
|---|---|---|---|---|
| GB | 1294665 | A | 11/1972 | |
| JP | 57-47353 | A | 3/1982 | |
| JP | 60-215009 | A | 10/1985 | |
| JP | 63-012672 | A | 1/1988 | |
| JP | 2003-506858 | A | 2/2003 | |
| JP | 2004-323652 | A | 11/2004 | |
| JP | 2005-223025 | A | 8/2005 | |
| JP | 2007-222722 | A | 9/2007 | |
| JP | 2009-296703 | A | 12/2009 | |
| JP | 2010-059441 | A | 3/2010 | |
| JP | 2010-059441 | A * | 3/2010 | ............ C08L 13/02 |
| JP | 2010-008321 | A * | 1/2012 | ............ G03G 15/16 |
| WO | 01/06579 | A2 | 1/2001 | |

OTHER PUBLICATIONS

International Search Report of PCT/JP2011/053812, mailing date Mar. 29, 2011.

Japanese Office Action dated Jun. 4, 2013, issued in corresponding Japanese Patent Application No. 2011-538789, with English translation (3 pages).

Notification of Reason(s) for Refusal dated Mar. 13, 2013, issued in corresponding Chinese Patent Application No. 201180003653X, with English translation (13 pages).

Extended European Search Report dated Jan. 12, 2015, issued in corresponding EP Application No. 11759123.0 (5 pages).

* cited by examiner

FIG. 1
(a)
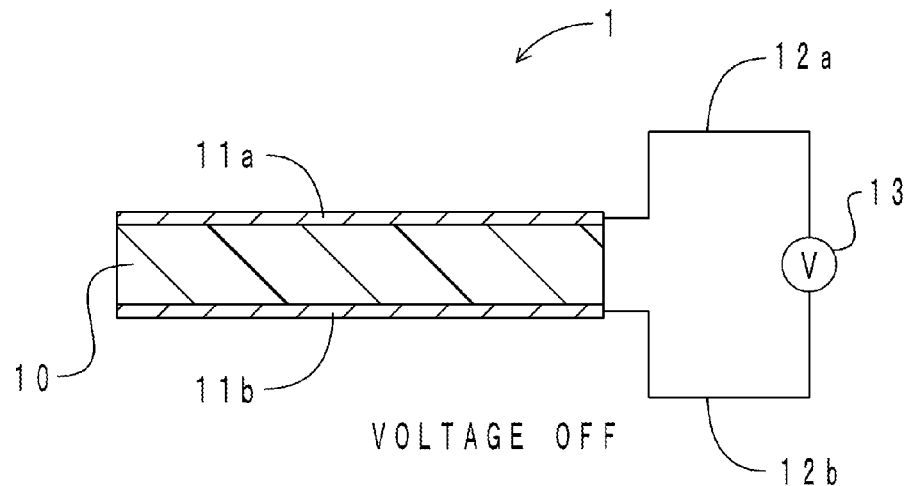
VOLTAGE OFF
(b)
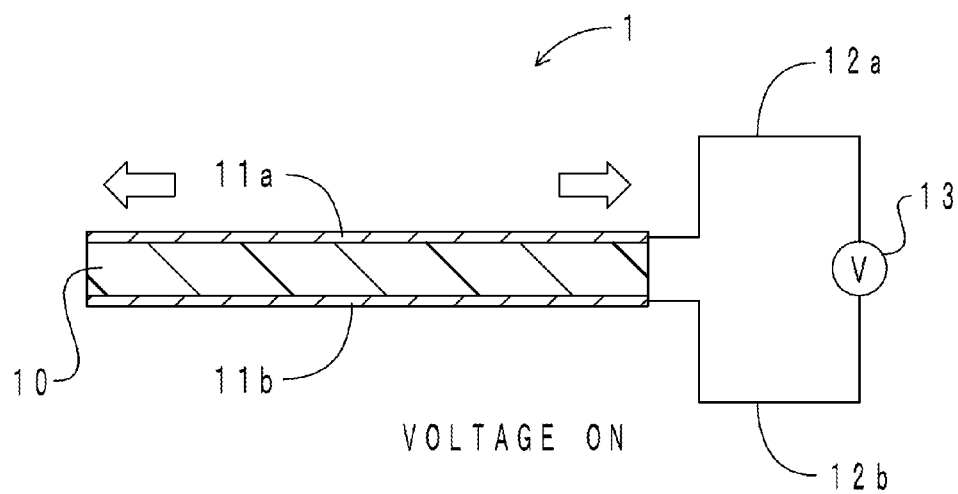
VOLTAGE ON

FIG. 4
(a) EXPANDED STATE
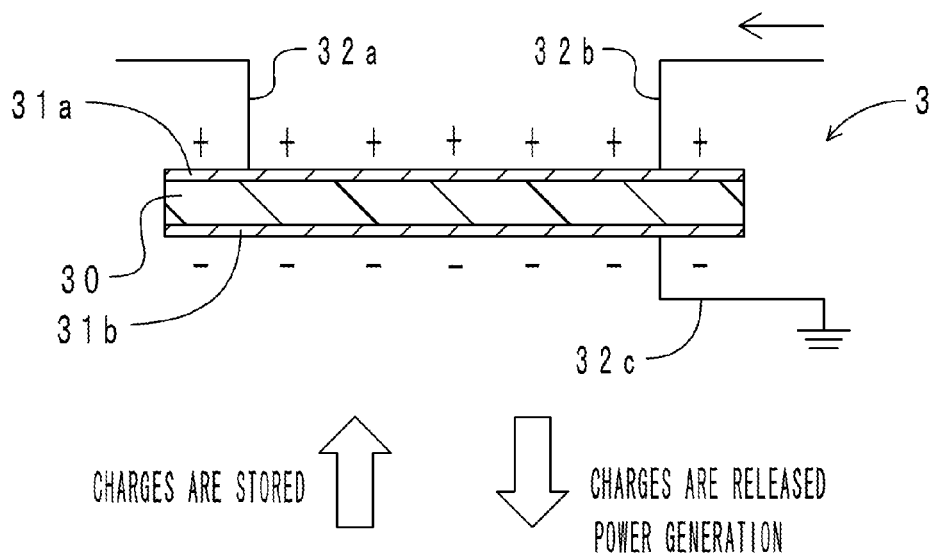
CHARGES ARE STORED ⇧ ⇩ CHARGES ARE RELEASED POWER GENERATION
(b) CONTRACTED STATE
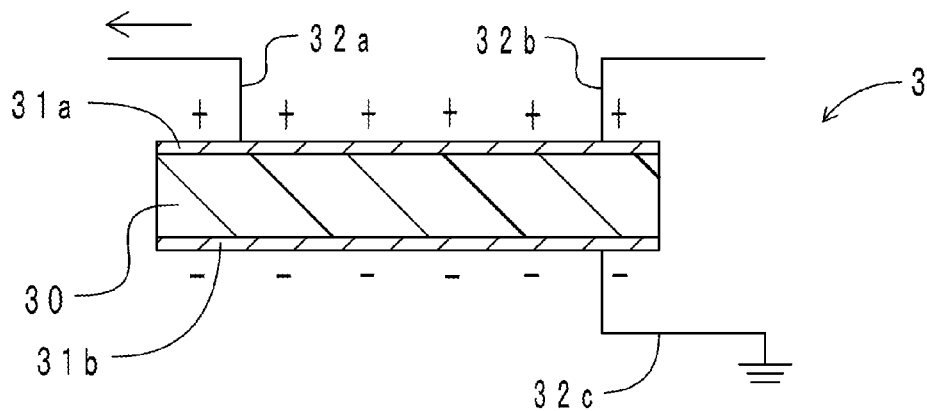

CONDUCTIVE CROSSLINKED BODY AND PRODUCTION PROCESS THEREOF, AND TRANSDUCER, FLEXIBLE WIRING BOARD AND ELECTROMAGNETIC WAVE SHIELD USING THE CONDUCTIVE CROSSLINKED BODY

TECHNICAL FIELD

The present invention relates to a conductive crosslinked body suitable for an expandable/contractible electrode, a wire, and the like and a production process thereof, and a transducer, a flexible wiring board and an electromagnetic wave shield using the conductive crosslinked body.

BACKGROUND ART

Development of a downsized and lightweight transducer having high flexibility utilizing a polymer material such as a dielectric elastomer has been progressed. As one example of the transducer, an actuator can be configured by interposing an elastomer dielectric film between a pair of electrodes (see Patent Documents 1 to 3, for example). In an actuator of this type, electrostatic attractive force between the electrodes increases with an increase of the voltage that is applied between the electrodes, so that the dielectric film that is sandwiched between the electrodes is compressed in the thickness direction and the thickness thereof decreases. As the film thickness decreases, the dielectric film correspondingly expands in the direction parallel to the electrode plane. As the voltage that is applied between the electrodes decreases, on the other hand, electrostatic attractive force between the electrodes decreases so that the compressive force acting on the dielectric film in the thickness direction decreases and the thickness thereof increases due to elastic restoring force thereof. As the film thickness increases, the dielectric film accordingly contracts in a direction parallel to the electrode plane. The electrode is fixed to both surfaces of the dielectric film in the thickness direction thereof. Therefore, it is required that the electrode be expandable/contractible in accordance with a deformation of the dielectric film so as not to hinder expansion and contraction of the dielectric film.

For example, a commercially available silver paste in which a silver powder is blended with a binder resin is poor in flexibility. Namely, the binder itself has a high elastic modulus and is highly filled with silver powder, so that the silver paste has a high elastic modulus and a low elongation at break. Therefore, when the silver paste is widely stretched, a crack occurs and the electric resistance extremely increases. When the silver paste is used for an electrode of an actuator, it cannot follow expansion and contraction of the dielectric film and it might inhibit a movement of the dielectric film.

On the other hand, for example, Patent Document 2 describes that a carbon nanofiber adheres to both surfaces of a dielectric film in the thickness direction thereof to form an electrode. Patent Document 3 describes that from a paste in which a conducting agent such as carbon black is blended with a binder such as an elastomer, an electrode is formed.

PRIOR ART DOCUMENTS

Patent Documents

Patent Document 1: Japanese Translation of PCT Application No. JP-T-2003-506858

Patent Document 2: Japanese Patent Application Publication No. JP-A-2005-223025

Patent Document 3: Japanese Patent Application Publication No. JP-A-2009-296703

SUMMARY OF THE INVENTION

Problem to be Solved by the Invention

As disclosed in Patent Document 2, when a fiber or powder having conductivity (conducting agent) adheres to a dielectric film without using a binder, the position of the conducting agent moves as the dielectric film repeats expansion and contraction, so that the distribution of the conducting agent may change. Under such a situation, a desired conductivity cannot be obtained. In addition, when the conducting agent falls off, it may contaminate the environment.

As described in Patent Document 3, when an elastomer is used as a binder, impurities in the elastomer may move into the dielectric film. Conceivable as the impurities are an unreacted crosslinker, crosslinking assistant, or the like remaining in the elastomer, or decomposition products (reaction residues) of the crosslinker, crosslinking assistant, or the like that remain in the elastomer. When impurities move into a dielectric film, an electric resistance of the dielectric film decreases. Thus, when a voltage is applied to the dielectric film, a current easily passes through the dielectric film. Namely, electric charges are less likely to be stored in an interface between the dielectric film and an electrode, leading to an increase in power consumption. When a current passes through the dielectric film, Joule heat is generated, which may change the physical properties of the dielectric film. Furthermore, the dielectric film may be destroyed. Therefore, a large voltage cannot be applied to the dielectric film. On the other hand, when an uncrosslinked elastomer is used as a binder taking into consideration a problem of impurities, deformation due to a repeat of expansion and contraction cannot be avoided, so that a desired durability of the dielectric film cannot be obtained.

The movement of impurities described above becomes a problem not only in an actuator but also in a sensor, a power generation element, or the like on which an electrode is arranged via a dielectric film. Furthermore, also when a wire is formed on the surface of a flexible substrate such as an elastomer using a paste that contains an elastomer as a binder, the movement of impurities becomes a problem. Namely, the movement of impurities from a wire to a flexible substrate decreases the electric resistance of the flexible substrate, so that a so-called leak current may increase.

The present invention has been made in view of the foregoing circumstances, it is an object of the present invention to provide a flexible conductive crosslinked body that is excellent in durability and has a small influence of a reaction residue after crosslinking on an object to which the conductive crosslinked body adheres, and to provide a production process of the conductive crosslinked body. It is also an object of the present invention to provide, using the conductive crosslinked body, a transducer, a flexible wiring board, and an electromagnetic wave shield that are excellent in performance stability and durability.

Means for Solving the Problem (1) In order to solve the above problems, the conductive crosslinked body of the present invention is characterized by being synthesized from a conductive composition containing a rubber polymer, an organic metal compound, and a conducting agent, wherein the conductive crosslinked body has a crosslinked structure.

The conductive crosslinked body of the present invention is produced by crosslinking an uncrosslinked rubber polymer with an organic metal compound. Alternatively, the conductive crosslinked body of the present invention is produced such that an uncrosslinked or crosslinked rubber polymer penetrates a crosslinked body of an organic metal compound. Namely, for the conductive crosslinked body of the present invention, a three-dimensional network structure by crosslinking is formed not by a conventional crosslinker but by an organic metal compound. In a sol-gel reaction by an organic metal compound, a reaction residue is not readily generated. It is considered that even when a reaction residue is generated, an influence thereof on an object to which the conductive crosslinked body adheres such as a dielectric film is small.

Accordingly, when an electrode formed of the conductive crosslinked body of the present invention is arranged on both surfaces of a dielectric film in the thickness direction to form an actuator, for example, an amount of impurities moving from the electrode into the dielectric film is small. Therefore, the electric resistance of the dielectric film is less likely to decrease. Thus, by a voltage applied between electrodes, a large amount of electric charges can be stored in an interface between the dielectric film and the electrode. With this, the power consumption can be reduced. In addition, the current does not easily pass through the dielectric film, so that a generation of Joule heat is suppressed. Accordingly, it is unlikely that the physical properties of the dielectric film change or the dielectric film is destroyed by heat.

The conductive crosslinked body of the present invention has a crosslinked structure. Therefore, when the conductive crosslinked body repeats expansion and contraction, it does not easily lose their resilience. Thus, the conductive crosslinked body is excellent in shape retention. Namely, the conductive crosslinked body of the present invention is not only flexible, but also excellent in durability. A conducting agent is dispersed in a binder having a crosslinked structure. Therefore, the distribution of the conducting agent is less likely to be changed by expansion and contraction of the conductive crosslinked body. Accordingly, even when the conductive crosslinked body repeats expansion and contraction, a desired conductivity can be obtained. It is also unlikely that the environment is contaminated due to the falling-off of the conducting agent.

(2) A process for producing the conductive crosslinked body of the present invention suitable for the production of the conductive crosslinked body of the present invention is characterized by including: a mixed solution preparing step for preparing a mixed solution in which the rubber polymer, the conducting agent, and the organic metal compound are mixed in a solvent that is capable of dissolving the rubber polymer and chelating the organic metal compound; and a crosslinking step for removing the solvent from the mixed solution so as to allow a crosslinking reaction to proceed.

The organic metal compound hydrolyzes due to a reaction with water and is polycondensed by dehydration or dealcoholization (sol-gel reaction) to form a crosslinked structure. The organic metal compound is generally highly reactive with water and difficult to handle. In the production process according to the present invention, it is possible to suppress abrupt reaction of the organic metal compound with water, by chelating the organic metal compound. Namely, in the production process of the present invention, the solvent not only dissolves the rubber polymer but also functions as a chelating agent. That is, in the mixed solution preparing step, the organic metal compound is chelated. Thus, the hydrolysis of the organic metal compound is suppressed. Then, in the crosslinking step, the solvent is removed. That is, the chelating agent is removed. As a result, the hydrolysis of the organic metal compound is accelerated so that the crosslinking by polycondensation proceeds.

Thus, with the production process of the present invention, the reaction speed of the organic metal compound can be decreased. In addition, raw materials are mixed in a solvent, so that the dispersion of the conducting agent is improved. Therefore, it is possible to obtain a homogeneous conductive crosslinked body. Because the solvent functions both as a solvent for dissolving the rubber polymer and as a chelating agent, it is not necessary to separately prepare a solvent for dissolving the rubber polymer and a chelating agent. Thus, the production process is simplified and is practical.

(3) A transducer of the present invention is characterized by including an elastomer dielectric film, a plurality of electrodes that is arranged via the dielectric film, and a wire that is connected with each of the plurality of electrodes, wherein at least one of the electrodes and the wire is formed of the conductive crosslinked body of the present invention.

Transducers can be actuators, sensors, electric power generation elements, etc. that perform conversion between mechanical energy and electrical energy. Alternatively, transducers can be speakers, microphones, etc. that perform conversion between acoustic energy and electrical energy. With respect to the transducer of the present invention, at least one of the electrodes and the wire is formed of the conductive crosslinked body of the present invention. Thus, when the dielectric film is deformed, the electrode or the like expands or contracts following the deformation of the dielectric film. Therefore, the movement of the transducer is less likely to be hindered by the electrode or the like. Even when repeating expansion and contraction, the electrode or the like does not easily lose its resilience. The conductivity of the electrode or the like is less likely to change. Furthermore, the amount of impurities moving from the electrode or the like to the dielectric film is small. Therefore, it is unlikely that the electric resistance of the dielectric film decreases. Accordingly, the transducer of the present invention is excellent in performance stability and durability.

(4) A flexible wiring board of the present invention is characterized by including an expandable/contractible flexible substrate and a wire that is arranged on a surface of the flexible substrate, wherein at least a part of the wire is formed of the conductive crosslinked body of the present invention.

According to the flexible wiring board of the present invention, the wire expands and contracts following a deformation of the flexible substrate. Even when repeating expansion and contraction, the wire does not easily lose its resilience. The conductivity of the wire is less likely to change. Furthermore, the amount of impurities moving from the wire to the flexible substrate is small. Therefore, it is unlikely that the electric resistance of the flexible substrate decreases and a so-called leak current increases. Accordingly, the flexible wiring board of the present invention is excellent in performance stability and durability.

(5) An electromagnetic wave shield of the present invention is characterized by including the conductive crosslinked body of the present invention.

The electromagnetic wave shield of the present invention can be formed from a mixed solution in which a raw material constituting the conductive crosslinked body of the present invention, such as a rubber polymer, is mixed in a solvent. The electromagnetic wave shield can also be formed by subjecting a kneaded product, which is produced by kneading a raw material, to press molding or injection molding without using a solvent. Accordingly, with respect to the electromagnetic wave shield of the present invention, the constraint for the shape is small. Therefore, the electromagnetic wave shield can easily be arranged in various portions that are to be shielded from an electromagnetic wave.

The electromagnetic wave shield of the present invention does not easily lose its resilience even when repeating expansion and contraction, and the conductivity thereof is less likely to change. Therefore, even when the electromagnetic wave shield is used for a member that is expandable/contractible, shielding performance is less likely to decrease. With respect to the electromagnetic wave shield of the present invention, impurities in the electromagnetic wave shield (conductive crosslinked body) are less likely to move to a member that is in contact with the electromagnetic wave shield. Therefore, it is unlikely that the electric resistance of the contacted member decreases and a leak current increases. Accordingly, it is unlikely that the physical properties of the contacted member change or the member is destroyed by Joule heat.

BRIEF DESCRIPTION OF THE DRAWINGS

FIG. 1 shows schematic cross-sectional views of an actuator that is an embodiment of a transducer of the present invention, where FIG. 1(a) shows an OFF state and FIG. 1(b) shows an ON state.

FIG. 4 shows schematic cross-sectional views of a power generation element that is an embodiment of the transducer of the present invention, where FIG. 4(a) shows an expanded state and FIG. 4(b) shows a contracted state.

DESCRIPTION OF REFERENCE NUMERALS

Figure 2:
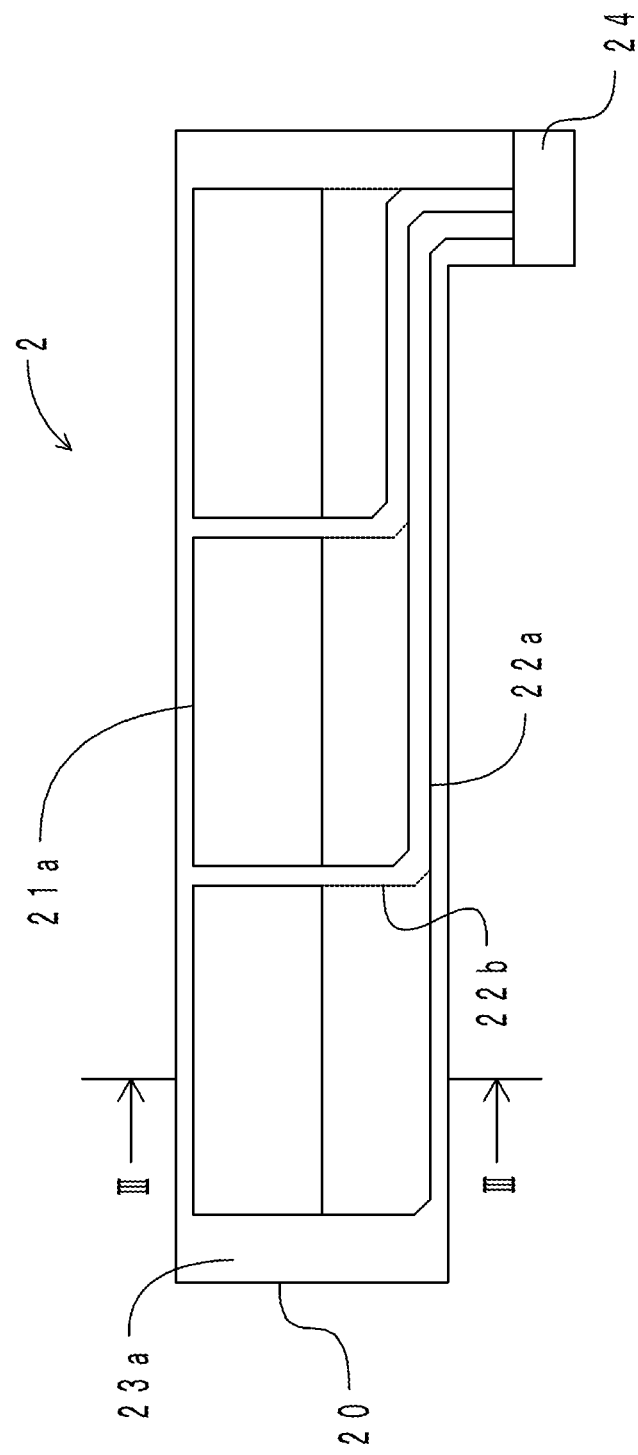
FIG. 2 is a top view of a capacitive sensor that is an embodiment of the transducer of the present invention.

1: actuator 10: dielectric film 11a, 11b: electrodes 12a, 12b: wires 13: power source 2: capacitive sensor (transducer) 20: dielectric film 21a, 21b: electrodes 22a, 22b: wires 23a, 23b: cover films 24: connector 3: power generation element (transducer) 30: dielectric film 31a, 31b: electrodes 32a to 32c: wires 4: flexible wiring board 40: flexible substrate 41: connector for surface side wires 42: connector for back side wires 01X to 16X: surface side electrodes 01X1 to 16X1: surface side connection portions 01Y to 16Y: back side electrodes 01Y1 to 16Y1: back side connection portions 01x to 16x: surface side wires 01y to 16y: back side wires 5: test element 50: object to which the conductive crosslinked body adheres 51a, 51b: test pieces 52: upper chuck 53: lower chuck

MODES FOR CARRYING OUT THE INVENTION

Hereinafter, a conductive crosslinked body and a production process thereof according to the present invention, and embodiments of a transducer, a flexible wiring board, and an electromagnetic wave shield according to the present invention will be described in this order.

<Conductive Crosslinked Body>

As described above, the conductive crosslinked body of the present invention is synthesized from a conductive composition containing a rubber polymer, an organic metal compound, and a conducting agent, and has a crosslinked structure.

(1) Rubber Polymer

The rubber polymer is not specifically limited. The rubber polymers may be used singly or as a mixture of two or more types thereof. As the rubber polymer, for example, a rubber polymer having a functional group capable of reacting with active hydrogen or a nucleophilic substituent having active hydrogen in the organic metal compound is desired. In this case, the functional group of the rubber polymer becomes a site for crosslinking with the organic metal compound. Namely, the functional group of the rubber polymer reacts with active hydrogen or a nucleophilic substituent having active hydrogen in the organic metal compound to form a crosslinked structure. The conductive crosslinked body of the present invention may have a so-called interpenetrating network structure in which the rubber polymer and the organic metal compound are not reacted with each other and the rubber polymer penetrates a crosslinked structure of the organic metal compound.

Examples of the functional group capable of reacting with the organic metal compound include a carboxy group, a hydroxy group, an amino group, and an epoxy group. Specific examples of the rubber polymer include a carboxy group-containing acrylonitrile-butadiene copolymer and a hydrogenated product thereof, a carboxy group-containing styrene-butadiene copolymer, a carboxy group-containing polybutadiene, a carboxy group-containing ethylene-propylene copolymer, a maleic acid-modified chlorinated polyethylene, a urethane pre-polymer having a hydroxy group or an amino group at a terminal thereof, an epoxy group-containing acrylic rubber, a carboxy group-containing acrylic rubber, and a polyester polyol.

(2) Organic Metal Compound

The type of the organic metal compound is not specifically limited. The organic metal compound may be liquid or solid. Examples of the organic metal compound include a metal alkoxide compound, a metal acylate compound, and a metal chelate compound. One type selected from these compounds may be singly used. Alternately, two or more selected from these compounds may be used in combination. It is desired that the organic metal compound contains one or more type(s) of elements selected from silicon, titanium, zirconium, hafnium, aluminum, gallium, magnesium, zinc, and boron.

A mixing amount of the organic metal compound is preferably 0.1 parts by mass or more and 50 parts by mass or less per 100 parts by mass of the rubber polymer. When the amount is less than 0.1 parts by mass, crosslinking does not proceed sufficiently, so that the three-dimensional network structure is not easily produced. The mixing amount is preferably 0.5 parts by mass or more. When the amount exceeds 50 parts by mass, on the other hand, crosslinking excessively proceeds and the flexibility of the conductive crosslinked body might be compromised. The mixing amount is preferably 30 parts by mass or less.

The metal alkoxide compound is, for example, a compound of General Formula (a):

$$M(OR)_m \qquad (a)$$

[where: M is an atom such as a metal; Rs are one or more type(s) of a $C_{1-10}$ alkyl group, aryl group, and alkenyl group, and may be the same as or different from each other; and m is a valence of an atom M such as a metal].

The metal alkoxide compound may also be a multimer having two or more recurring units [$(MO)_n$; n is an integer of 2 or more] within a molecule. By varying the number n, it is possible to control the compatibility with the rubber polymer, the reaction rate, and the like of the metal alkoxide compound. Therefore, it is advisable to select a suitable multimer depending on the type of the rubber polymer.

Examples of the atom M such as a metal include titanium, zirconium, aluminum, silicon, iron, copper, tin, barium, strontium, hafnium, and boron. Among them, for reasons of good reactivity, the atom M contains preferably one or more type(s) selected from titanium, zirconium, and aluminum. Specific examples of the suitable metal alkoxide compound include tetra n-butoxy titanium, tetra n-butoxy zirconium, tetra n-butoxy silane, acetoalkoxy aluminum diisopropylate, tetra i-propoxy titanium, tetraethoxy silane, and tetrakis(2-ethylhexyloxy) titanium.

Examples of the metal acylate compound include polyhydroxy titanium stearate and zirconium tributoxy monostearate.

Examples of the metal chelate compound include: a titanium chelate compound such as titanium-diisopropoxy-bis(acetylacetonate), titanium-tetraacetylacetonate, titanium-dioctyloxy-bis(octyleneglycolate), titanium-diisopropoxy-bis(ethylacetoacetate), titanium-diisopropoxy-bis(triethanolaminate), and titanium-dibutoxy-bis(triethanolaminate); and a zirconium chelate compound such as zirconium tetraacetylacetonate, zirconium tributoxymonoacetylacetonate, zirconium monobutoxyacetylacetonate-bis(ethylacetoacetate), and zirconium dibutoxy-bis(ethylacetoacetate).

(3) Conducting Agent

The type of the conducting agent is not specifically limited. The conducting agent may be accordingly selected from: a carbon material such as carbon black, carbon nanotube, and graphite; a metal material such as silver, gold, copper, nickel, rhodium, palladium, chromium, titanium, platinum, iron, and an alloy thereof; and a conductive oxide in which another metal is doped in titanium oxide, indium oxide, or zinc oxide. The conducting agents may be used singly or as a mixture of two or more types thereof. For example, carbon black is preferred in terms that carbon black has high adhesion to a rubber component and is aggregated to easily form a conducting path. Among them, a high conductive carbon black such as ketjen black is preferred.

There may also be used coated particles to which conductivity is imparted by coating the surface of particles with a metal. The specific gravity of a coated particle is smaller than that of a particle of a metal simple substance. Therefore, when a coated particle is converted into a coating, the particle is less likely to be precipitated, so that the dispersibility of the particle in the coating is enhanced. In addition, by processing the particle, a coated particle in various shapes can be easily produced. As the metal with which the particle is coated, metal materials exemplified above may be used. For the particle, there may be used a carbon material such as graphite and carbon black, a metal oxide such as calcium carbonate, titanium dioxide, aluminum oxide, and barium titanate, an inorganic substance such as silica, and a resin such as acrylic and urethane.

The content of the conducting agent may be determined so that a desired conductivity can be obtained. For example, from the viewpoint of securing a conductivity as an electrode, the content of the conducting agent is preferably 0.1 vol % or more per 100 vol % of the volume of the conductive crosslinked body. More preferably, the content is 1 vol % or more. On the other hand, as the content of the conducting agent becomes larger, the flexibility of the conductive crosslinked body decreases. Therefore, the content of the conducting agent is preferably 35 vol % or less, more preferably 15 vol % or less per 100 vol % of the volume of the conductive crosslinked body.

(4) Others

When the conductive crosslinked body of the present invention is synthesized, the conductive composition containing the rubber polymer, the organic metal compound, and the conducting agent may be accordingly blended with a catalyst, a reinforcing agent, a plasticizer, an age resister, a coloring agent, or the like.

When the conductive crosslinked body of the present invention is used as an electrode or a wire for an actuator, from the viewpoints of downsizing the actuator and minimizing the influence of deformation of the dielectric film, it is preferable that the thickness of the electrode or the like (conductive crosslinked body) be smaller. For example, the thickness of the conductive crosslinked body is set to be preferably 0.4 μm or more and 1000 μm or less, more preferably 5 μm or more and 50 μm or less.

<Production Process of Conductive Crosslinked Body>

The production process of the conductive crosslinked body of the present invention is not specifically limited. The conductive crosslinked body can be produced, for example, by a method shown in (1) or (2) below.

(1) In a first method, a rubber polymer, an organic metal compound, and a conducting agent are kneaded with a roll or a kneader (kneading step), and the kneaded product is formed under predetermined conditions (forming step). The formed conductive crosslinked body may adhere to a predetermined substrate to be used.

(2) In a second method, first, a rubber polymer and a conducting agent are added to a predetermined solvent. Next, into the resultant solution, an organic metal compound as it is or dissolved in a predetermined solvent is mixed to prepare a mixed solution (mixed solution preparing step). Then, the prepared mixed solution is applied to a substrate and dried under predetermined conditions (forming step).

In the above first and second methods, by previously kneading the rubber polymer together with the conducting agent, the dispersibility of the conducting agent is improved. For example, in the second method, the rubber polymer and the conducting agent may be previously kneaded with a roll or a kneader, and the resulting kneaded mixture may be added to the solvent. In addition, in the second method, a solution of the rubber polymer in a solvent and a dispersion of the conducting agent in a solvent may also be mixed.

In the second method, when the organic metal compound, which is dissolved in a predetermined solvent, is mixed in, this solvent may be the same as or different from the solvent for dissolving the rubber polymer. In the first method, a catalyst, a reinforcing agent, a plasticizer, an age resister, a coloring agent, etc. may be added in the kneading step as needed. In the second method, a catalyst, a reinforcing agent, a plasticizer, an age resister, a coloring agent, etc. may be added, as needed, in the mixed solution preparing step.

As the method for applying the mixed solution on the substrate, a publicly known method may be adopted. Examples of the publicly known method include, a dipping method, a spraying method, and a bar coating method, in addition to a printing method such as inkjet printing, flexo printing, gravure printing, screen printing, pad printing, and lithography. When the printing method is adopted, it is easy to distinguish a portion to which the mixed solution is applied from a portion to which the mixed solution is not applied. It is also easy to print a large area, a thin line, and a complicated shape. Among the printing methods, the screen printing method is preferred because a high-viscosity coating can be used and the thickness of the coating film can be easily controlled.

The organic metal compound reacts with water in the air or in the reaction system (rubber polymer, solution) to undergo hydrolysis and polycondensation (sol-gel reaction). It is, therefore, desirable to use the organic metal compound that is chelated using a chelating agent in order to suppress the abrupt reaction with water and to form a homogeneous film. In particular, a metal alkoxide compound has high reactivity and, hence, is desired to be used in a chelated form. A metal acylate compound, on the other hand, is not so reactive, compared with the metal alkoxide compound and, therefore, the necessity for chelating is low.

Examples of the chelating agent include β-diketones such as acetyl acetone, benzoyl acetone, and dibenzoylmethane, β-keto acid esters such as ethyl acetoacetate and ethyl benzoylacetate, triethanolamine, lactic acid, 2-etylhexane-1, 3diol and 1,3hexanediol. The chelating agent is desirably used in an amount of 10 parts by mass or more and 100,000 parts by mass or less per 100 parts by mass of the organic metal compound. When the amount is less than 10 parts by mass, the organic metal compound cannot be sufficiently chelated. The mixing amount is preferably 50 parts by mass or more. When the amount exceeds 100,000 parts by mass, it is difficult to remove the chelating agent and, therefore, the drying, for example, must be performed excessively. The mixing amount is preferably 8,000 parts by mass or less.

When the organic metal compound is used in a chelated form, it is advisable to adopt, for example, the following method. First, into a predetermined solvent, a rubber polymer and a conducting agent are added. Next, the organic metal compound in a chelated form is mixed in the resultant solution to prepare the mixed solution (mixed solution preparing step). Then, the prepared mixed solution is applied to a substrate and dried under predetermined conditions, and the chelating agent is removed to allow a crosslinking reaction to proceed (crosslinking step).

When the chelating agent is capable of dissolving the rubber polymer, it is possible to use the chelating agent as a solvent for dissolving the rubber polymer. In this case, it is advisable to adopt the following method, for example. A mixed solution in which the rubber polymer, the conducting agent, and the organic metal compound are mixed in a solvent that is capable of dissolving the rubber polymer and of chelating the organic metal compound is first prepared (mixed solution preparing step). Next, the solvent is removed from the mixed solution to allow a crosslinking reaction to proceed (crosslinking step). The mixed solution preparing step may be constituted of a step of preparing a first solution containing the rubber polymer and the conducting agent and a step of preparing a second solution by mixing the first solution with the organic metal compound.

The solvent may consist only of the chelating agent or may be a mixture of the chelating agent and other solvent. In the crosslinking step, it is only necessary to apply the mixed solution to a substrate and dry it. The temperature for the crosslinking step may be accordingly determined depending on the type of the solvent, taking into consideration the reaction rate and the like. For example, normal temperature may be employed. However, a temperature that is not lower than the boiling point of the solvent is desirable. Even when the organic metal compound in a chelated form is used, a catalyst, a reinforcing agent, a plasticizer, an age resister, a coloring agent, etc. may be added in the mixed solution preparing step as needed.

<Transducer>

The transducer of the present invention includes an elastomer dielectric film, a plurality of electrodes that are arranged via the dielectric film, and a wire connected with each of the plurality of electrodes, and at least one of the electrodes and the wire is formed of the conductive crosslinked body of the present invention. Also in the transducer of the present invention, it is desired to adopt the above-described preferred embodiments of the conductive crosslinked body of the present invention. Hereinafter, as examples of the transducer of the present invention, the embodiments of an actuator, an elastomer sensor, and a power generation element are described.

[Actuator]

The embodiment of an actuator including an electrode formed of the conductive crosslinked body of the present invention is described. FIG. 1 shows schematic cross-sectional views of an actuator of the present embodiment, in which FIG. 1(a) shows an OFF state and FIG. 1(b) shows an ON state.

As shown in FIG. 1, an actuator 1 includes a dielectric film 10, electrodes 11a, 11b, and wires 12a, 12b. The dielectric film 10 is made of aurethane rubber. The electrode 11a is arranged so as to cover substantially the entire top face of the dielectric film 10. In the same manner, the electrode 11b is arranged so as to cover substantially the entire bottom face of the dielectric film 10. The electrodes 11a, 11b are connected to a power source 13 through the wires 12a, 12b, respectively. Each of the electrodes 11a, 11b is formed of the conductive crosslinked body of the present invention.

The actuator is turned from the OFF state to the ON state when a voltage is applied between the pair of electrodes 11a and 11b. Upon the application of the voltage, the thickness of the dielectric film 10 becomes smaller, and the dielectric film 10 accordingly expands in a direction parallel to the planes of the electrodes 11a, 11b as shown by the white arrows in FIG. 1(b). As a result, the actuator 1 outputs driving forces in the up-down direction and the left-right direction.

According to the present embodiment, the electrodes 11a, 11b are flexible and expandable/contractible. Therefore, the electrodes 11a, 11b can deform following a deformation of the dielectric film 10. Namely, the movement of the dielectric film 10 is less likely to be hindered by the electrodes 11a, 11b. Accordingly, by the actuator 1, a larger force and a larger displacement can be obtained.

According to the present embodiment, the amount of impurities moving from the electrodes 11a, 11b to the dielectric film 10 is small. Therefore, the electric resistance of the dielectric film 10 is less likely to decrease. Thus, a large amount of electric charges can be stored in an interface between the dielectric film 10 and the electrodes 11a, 11b, which reduces power consumption. In addition, because a current does not easily flow through the dielectric film 10, generation of Joule heat is suppressed. For this reason, there is low possibility that the physical properties of the dielectric film 10 change or the dielectric film 10 is thermally broken. The electrodes 11a, 11b do not easily lose their resilience even when repeating expansion and contraction. Thus, the electrodes 11a, 11b are excellent in shape retention. In addition, the conductivity of the electrodes 11a, 11b is less likely to change. Accordingly, the actuator 1 is excellent in performance stability and durability.

As the dielectric film constituting the actuator, an elastomer having a high dielectric constant is preferably used. Specifically, the elastomer has a dielectric constant (100 Hz) at normal temperature of preferably 2 or more, more preferably 5 or more. It is preferred to adopt, for example, an elastomer having a polar functional group such as an ester group, a carboxy group, a hydroxy group, a halogen group, an amide group, a sulfon group, a urethane group, and a nitrile group, or an elastomer to which a polar low molecular weight compound having such a polar functional group is added. Preferred examples of the elastomer include, besides the above urethane rubber, a silicone rubber, an acrylonitrile-butadiene rubber (NBR), a hydrogenated acrylonitrile-butadiene rubber (H-NBR), an ethylene-propylene-diene rubber (EPDM), an acrylic rubber, an epichlorohydrin rubber, a chloro-sulfonated polyethylene, and a chlorinated polyethylene.

The thickness of the dielectric film may be appropriately determined according to the intended use of the actuator or the like. For example, it is preferred that the thickness of the dielectric film be small from the viewpoint of downsizing of the actuator, capability of driving at a low voltage, large displacement, etc. In this case, also in consideration of insulation breakdown and the like, it is desired that the thickness of the dielectric film be 1 µm or more and 1,000 µm (1 mm) or less, more preferably 5 µm or more and 200 µm or less.

For further increasing the displacement of the actuator, it is preferable that the dielectric film be arranged while being stretched in the surface-extending direction thereof. In addition, when a laminated structure is employed with dielectric films and electrodes laminated alternately, a higher output can be obtained. By this, the actuator achieves a higher output, and a member to be driven can be driven with a larger force.

[Elastomer Sensor]

Figure 3:
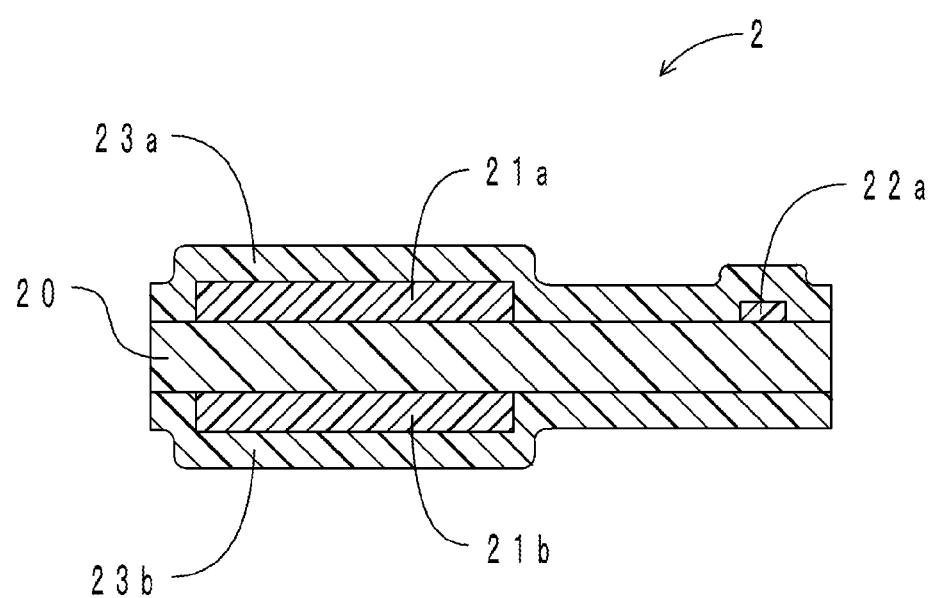
FIG. 3 is a III-III cross-sectional view of FIG. 2.

As one example of the elastomer sensor including the electrode and the wire that are each formed of the conductive crosslinked body of the present invention, description will be made of an embodiment of a capacitive sensor. First, the constitution of the capacitive sensor of the present embodiment is described. FIG. 2 shows a top view of the capacitive sensor. FIG. 3 shows a III-III cross-sectional view of FIG. 2. As shown in FIG. 2 and FIG. 3, a capacitive sensor 2 includes a dielectric film 20, a pair of electrodes 21a, 21b, wires 22a, 22b, and cover films 23a, 23b.

The dielectric film 20 is made of a urethane rubber and is in the form of a strip that extends in the left-right direction. The dielectric film 20 has a thickness of about 300 µm.

The electrode 21a has a rectangular shape. Three electrodes 21a are formed on the top face of the dielectric film 20 by screen printing. The electrode 21b also has a rectangular shape. Three electrodes 21b are formed on the bottom face of the dielectric film 20 so as to face the electrodes 21a via the dielectric film 20. The electrode 21b is screen-printed on the bottom face of the dielectric film 20. In this manner, three pairs of the electrodes 21a, 21b are arranged so as to sandwich the dielectric film 20. The electrodes 21a, 21b are formed of the conductive crosslinked body of the present invention.

The wire 22a is connected with each of the electrodes 21a formed on the top face of the dielectric film 20. By the wire 22a, the electrode 21a and a connector 24 are connected. The wire 22a is formed on the top face of the dielectric film 20 by screen printing. In the same manner, the wire 22b is connected with each of the electrodes 21b formed on the bottom face of the dielectric film 20 (shown with a dotted line in FIG. 2). Through the wire 22b, the electrode 21b and a connector (not shown) are connected. The wire 22b is formed on the bottom face of the dielectric film 20 by screen printing. The wires 22a, 22b are formed of the conductive crosslinked body of the present invention.

The cover film 23a is made of an acrylic rubber and is in the form of a strip that extends in the left-right direction. The cover film 23a covers the top face of the dielectric film 20, the electrode 21a, and the wire 22a. Also, the cover film 23b is made of an acrylic rubber and is in the form of a strip that extends in the left-right direction. The cover film 23b covers the bottom face of the dielectric film 20, the electrode 21b, and the wire 22b.

Next, the movement of a capacitive sensor 2 is described. For example, when the capacitive sensor 2 is pressed from above, the dielectric film 20, the electrode 21a, and the cover film 23a are bent downward in an integrated manner. Due to compression, the thickness of the dielectric film 20 becomes smaller. As a result, a capacitance between the electrodes 21a, 21b becomes larger. By this change in the capacitance, a deformation due to compression is detected.

Next, the effects of the capacitive sensor 2 of the present embodiment are described. According to the present embodiment, each of the dielectric film 20, the electrodes 21a, 21b, the wires 22a, 22b, and the cover films 23a, 23b is made of an elastomer material. Therefore, the entire capacitive sensor 2 is flexible and expandable/contractible. The electrodes 21a, 21b and the wires 22a, 22b can deform following a deformation of the dielectric film 20.

According to the present embodiment, the amount of impurities moving from the electrodes 21a, 21b to the dielectric film 20 is small. Therefore, the electric resistance of the dielectric film 20 is less likely to decrease. Namely, the current does not easily pass through the dielectric film 20, so that it is unlikely that the detection precision decreases. In addition, the current does not easily pass through the dielectric film 20, so that the generation of Joule heat is suppressed. Accordingly, it is unlikely that the physical properties of the dielectric film 20 change or the dielectric film 20 is destroyed by heat. Even when the electrodes 21a, 21b and the wires 22a, 22b repeat expansion and contraction, they do not easily lose their resilience. Thus, the electrodes 21a, 21b and the wires 22a, 22b are excellent in shape retention. In addition, the conductivity of the electrodes 21a, 21b and the wires 22a, 22b is less likely to change. Accordingly, the capacitive sensor 2 is excellent in performance stability and durability. In the capacitive sensor 2 of the present embodiment, three pairs of the electrodes 21a, 21b are formed so as to sandwich the dielectric film 20. However, the number, size, and arrangement of the electrodes may be accordingly determined depending on the intended use thereof

[Power Generation Element]

An embodiment of a power generation element including an electrode formed of the conductive crosslinked body of the present invention is described. In FIG. 4 shows schematic cross-sectional views of the power generation element of the present embodiment. FIG. 4(a) shows the power generation element in an expanded state and FIG. 4(b) shows that in a contracted state. As shown in FIG. 4, a power generation element 3 includes a dielectric film 30, electrodes 31a, 31b, and wires 32a to 32c. The dielectric film 30 is made of a urethane rubber. The electrode 31a is arranged so as to cover substantially the entire top face of the dielectric film 30. In the same manner, the electrode 31b is arranged so as to cover substantially the entire bottom face of the dielectric film 30. To the electrode 31a, the wires 32a, 32b are connected. Namely, the electrode 31a is connected with an external load (not shown) through the wire 32a. The electrode 31a is connected with a power source (not shown) through the wire 32b. The electrode 31b is grounded through the wire 32c. Each of the electrodes 31a, 31b is formed of the conductive crosslinked body of the present invention.

As shown in FIG. 4(a), when the power generation element 3 is compressed to stretch the dielectric film 30 in a direction parallel to the planes of the electrodes 31a, 31b, the film thickness of the dielectric film 30 becomes smaller so that electric charges are stored between the electrodes 31a, 31b. Then, when the compressing force is released, the dielectric film 30 contracts due to an elastic restoring force of the dielectric film 30, as shown in FIG. 4(b), so that the film thickness thereof becomes larger. At this time, the stored electric charges are discharged through the wire 32a.

According to the present embodiment, the electrodes 31a, 31b are flexible and expandable/contractible. Therefore, the electrodes 31a, 31b can deform following a deformation of the dielectric film 30. Namely, the movement of the dielectric film 30 is less likely to be hindered by the electrodes 31a, 31b. According to the present embodiment, the amount of impurities moving from the electrodes 31a, 31b to the dielectric film 30 is small. Therefore, the electric resistance of the dielectric film 30 is less likely to decrease. The current does not easily pass through the dielectric film 30, so that a large amount of electric charges can be stored in an interface between the dielectric film 30 and the electrodes 31a, 31b. Accordingly, the power generating efficiency can be enhanced. Furthermore, the generation of Joule heat is suppressed. Therefore, it is unlikely that the physical properties of the dielectric film 30 change or the dielectric film 30 is destroyed by heat. Further, the electrodes 31a, 31b do not easily lose their resilience even when repeating expansion and contraction. Thus, the electrodes 31a, 31b are excellent in shape retention. In addition, the conductivity of the electrodes 31a, 31b is less likely to change. Accordingly, the power generation element 3 is excellent in performance stability and durability.

<Flexible Wiring Board>

The flexible wiring board of the present invention includes an expandable/contractible flexible substrate and a wire arranged on the surface of the flexible substrate, and at least a part of the wire is formed of the conductive crosslinked body of the present invention. Also in the flexible wiring board of the present invention, it is desired to adopt the preferred embodiments of the conductive crosslinked body of the present invention. Hereinafter, an embodiment of the flexible wiring board of the present invention is described.

Figure 5:
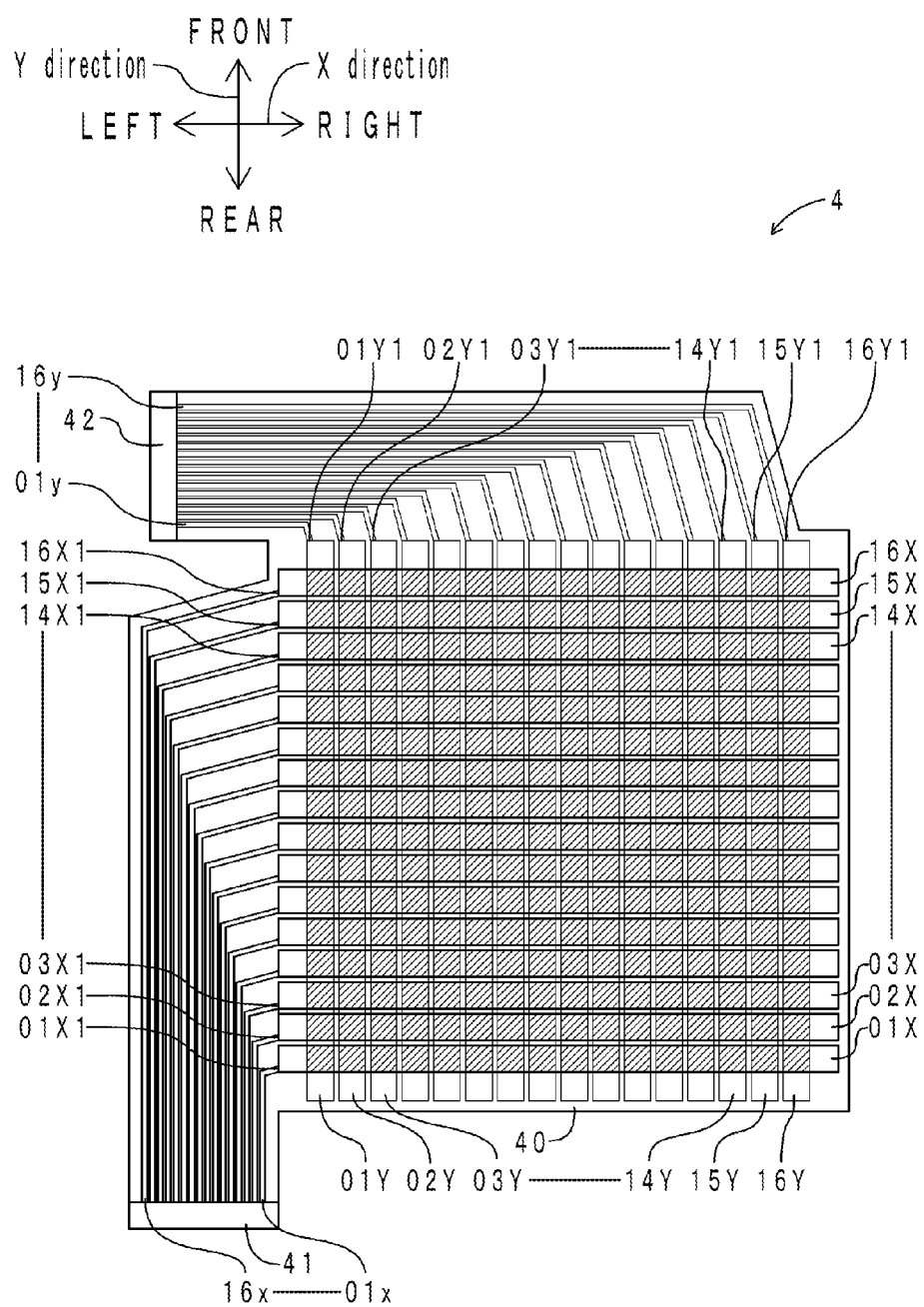
FIG. 5 is a top face transmission view showing a flexible wiring board that is an embodiment of the present invention.

FIG. 5 shows a top face transmission view of the flexible wiring board of the present invention. In FIG. 5, wires in the back side are shown with a thin line. As show in FIG. 5, a flexible wiring board 4 includes a flexible substrate 40, surface side electrodes 01X to 16X, back side electrodes 01Y to 16Y, surface side wires 01x to 16x, back side wires 01y to 16y, a connector 41 for surface side wires, and a connector 42 for back side wires.

The flexible substrate 40 is made of a urethane rubber and has a sheet shape. The surface side electrodes 01X to 16X are arranged on the top face of the flexible substrate 40 in a total number of 16. Each of the surface side electrodes 01X to 16X has a strip shape. Each of the surface side electrodes 01X to 16X extends in an X direction (left-right direction). The surface side electrodes 01X to 16X are arranged substantially in parallel to each other with a predetermined interval in a Y direction (front-rear direction). At respective left ends of the surface side electrodes 01X to 16X, surface side connection portions 01X1 to 16X1 are arranged. In the same manner, the back side electrodes 01Y to 16Y are arranged on the bottom face of the flexible substrate 40 in a total number of 16. Each of the back side electrodes 01Y to 16Y has a strip shape. Each of the back side electrodes 01Y to 16Y extends in a Y direction. The back side electrodes 01Y to 16Y are arranged substantially in parallel to each other with a predetermined interval in the X direction. At respective front ends of the back side electrodes 01Y to 16Y, back side connection portions 01Y1 to 16Y1 are arranged. As shown by a hatching in FIG. 5, a detection portion for detecting a load or the like is formed of a section where the surface side electrodes 01X to 16X and the back side electrodes 01Y to 16Y cross each other (overlap) so as to sandwich the flexible substrate 40.

The surface side wires 01x to 16x are arranged on the top face of the flexible substrate 40 in a total number of 16. Each of the surface side wires 01x to 16x has a line shape. The connector 41 for surface side wires is arranged in a left rear corner of the flexible substrate 40. Each of the surface side wires 01x to 16x connects each of the surface side connection portions 01X1 to 16X1 with the connector 41 for surface side wires. The top face of the flexible substrate 40, the surface side electrodes 01X to 16X, and the surface side wires 01x to 16x are covered by a surface side cover film (not shown) from above. The surface side wires 01x to 16x are formed of the conductive crosslinked body of the present invention.

The back side wires 01y to 16y are arranged on the bottom face of the flexible substrate 40 in a total number of 16. Each of the back side wires 01y to 16y has a line shape. The connector 42 for back side wires is arranged in a left front corner of the flexible substrate 40. Each of the back side wires 01y to 16y connects each of the back side connection portions 01Y1 to 16Y1 with the connector 42 for back side wires. The bottom face of the flexible substrate 40, the back side electrodes 01Y to 16Y, and the back side wires 01y to 16y are covered by a back side cover film (not shown) from below. The back side wires 01y to 16y are formed of the conductive crosslinked body of the present invention.

To each of the connector 41 for surface side wires and the connector 42 for back side wires, an operation part (not shown) is electrically connected. Into the operation part, an impedance in the detection portion is input from the surface side wires 01x to 16x and the back side wires 01y to 16y. Based on the input impedance, a surface pressure distribution is measured.

According to the present embodiment, each of the surface side wires 01x to 16x and the back side wires 01y to 16y is flexible and expandable/contractible. Therefore, the surface side wires 01x to 16x and the back side wires 01y to 16y can deform following a deformation of the flexible substrate 40. According to the present embodiment, the amount of impurities moving from the surface side wires 01x to 16x and the back side wires 01y to 16y to the flexible substrate 40 is small. Therefore, it is unlikely that the electric resistance of the flexible substrate 40 decreases and a so-called leak current increases. Thus, a malfunction is suppressed. The current does not easily pass through the flexible substrate 40, so that it is unlikely that the flexible substrate 40 is destroyed by Joule heat. Furthermore, the surface side wires 01x to 16x and the back side wires 01y to 16y do not easily lose their resilience even when repeating expansion and contraction. Thus, the surface side wires 01x to 16x and the back side wires 01y to 16y are excellent in shape retention. In addition, the conductivity thereof is less likely to change. Accordingly, the flexible wiring board 4 is excellent in performance stability and durability.

<Electromagnetic Wave Shield>

The electromagnetic wave shield of the present invention is formed of the conductive crosslinked body of the present invention. The electromagnetic wave shield performs functions of suppressing an electromagnetic wave generated inside an electronic device from leaking to the outside, and of suppressing an outside electromagnetic wave from entering the inside of the electronic device. For example, for arranging the electromagnetic wave shield on an inner peripheral surface of a housing of an electronic device, a mixed solution for forming the conductive crosslinked body of the present invention may be applied to the inner peripheral surface of the housing of the electronic device and dried. In addition, in the capacitive sensor shown as an embodiment of the transducer, the electromagnetic wave shield can also be arranged. For example, the electromagnetic wave shield may be arranged so as to cover each of the top face of the cover film 23a and the bottom face of the cover film 23b (see FIG. 2 and FIG. 3). In this case, a mixed solution for forming the conductive crosslinked body of the present invention may be applied to the top face of the cover film 23a and the bottom face of the cover film 23b and dried. Furthermore, when the electromagnetic wave shield is arranged in a gap of an electronic device as a gasket, the conductive crosslinked body of the present invention may be formed into a desired shape for use.

EXAMPLES

Next, the present invention is described more specifically based on Examples.
<Production of Conductive Crosslinked Body>

Examples 1 to 4

Conductive crosslinked bodies of Examples 1 to 4 were produced from the raw materials that are shown in Table 1. First, a carboxy group-containing acrylic rubber polymer (manufactured by Zeon Corporation, "Nipol (registered trade mark) AR14") or an epoxy group-containing acrylic rubber polymer (manufactured by Zeon Corporation, "Nipol AR42W") and a conducting agent (manufactured by Lion Corporation, "Ketjen black (registered trade mark) EC-600JD") were kneaded with a roll kneader to prepare a rubber composition. Next, the thus prepared rubber composition was dissolved in acetyl acetone. Subsequently, into the resulting solution, a predetermined organic metal compound was added to be mixed. Here, the acetyl acetone served not only as a solvent for dissolving the acrylic rubber polymer, but also as a chelating agent for the organic metal compound. The mixed solution was thereafter applied to a substrate by a bar coating method, dried, and then heated at 150° C. for about 60 minutes to obtain each conductive crosslinked body. Here, as the organic metal compound, the following were used.

Tetra-n-butoxy titanium: manufactured by Nippon Soda Co., Ltd.; "B-1"
Zirconium tetraacetylacetonate: manufactured by Matsumoto Fine Chemical Co., Ltd.; "Orgatix (registered trade mark) ZC150"
Polyhydroxy titanium stearate: manufactured by Matsumoto Fine Chemical Co., Ltd.; "Orgatix TPHS"

Comparative Example 1

The conductive material of Comparative Example 1 was produced from the raw materials that are shown in Table 1. First, an epoxy group-containing acrylic rubber polymer (the same as described above), and zinc dimethyldithiocarbamate (manufactured by Ouchi Shinko Chemical Industrial Co., Ltd., "NOCCELER (registered trade mark) PZ") and iron (III) dimethyldithiocarbamate (manufactured by Ouchi Shinko Chemical Industrial Co., Ltd., "NOCCELER TTFE") that are crosslinking accelerators, were kneaded with a roll kneader to prepare a rubber composition. Next, the thus prepared rubber composition was dissolved in methyl ethyl ketone (MEK). Then, into the resultant solution, a conducting agent (the same as described above) was added and dispersed. Subsequently, the prepared solution was applied to a substrate by a bar coating method. Then, the substrate on which a coating film was formed was left stand still in a drying oven of about 170° C. for about 30 minutes so as to dry the coating film and allow the crosslinking reaction to proceed. Thus, a conductive material is obtained.

Comparative Example 2

The conductive material of Comparative Example 2 was produced from the raw materials that are shown in Table 1. First, an epoxy group-containing acrylic rubber polymer (the same as described above) was dissolved in MEK. Next, into the resultant solution, a conducting agent (the same as described above) was added and dispersed. Subsequently, the thus prepared solution was applied to a substrate by a bar coating method. Then, the substrate on which a coating film was formed was left stand still in a drying oven of about 150° C. for about 30 minutes to dry the coating film to obtain a conductive material.

In Table 1, the type and the blended amount of the used raw material are shown.

TABLE 1

| | | Example 1 | Example 2 | Example 3 | Example 4 | Comparative Example 1 | Comparative Example 2 |
|---|---|---|---|---|---|---|---|
| Rubber polymer | Carboxy group-containing acrylic rubber polymer | 100 | 100 | 100 | — | — | — |
| | Epoxy group-containing acrylic rubber polymer | — | — | — | 100 | 100 | 100 |
| Organic metal compound | Tetra-n-butoxy titanium | 2 | — | — | 2 | — | — |
| | Zirconium tetraacetylacetonate | — | 2 | — | — | — | — |
| | Polyhydroxy titanium stearate | — | — | 2 | — | — | — |
| Conducting agent | Ketjen black | 10 | 10 | 10 | 10 | 10 | 10 |
| Crosslinking accelerator | Zinc dimethyldithiocarbamate | — | — | — | — | 2.5 | — |
| | Iron (III) dimethyldithiocarbamate | — | — | — | — | 0.5 | — |
| Solvent | Acetyl acetone | 2000 | 1000 | 2000 | 2000 | — | — |
| | Methyl ethyl ketone | — | — | — | — | 1000 | 1000 |
| Content of conducting agent [% by vol] | | 5.3 | 5.3 | 5.2 | 5.2 | 5.2 | 5.3 |
| Evaluation results | Content of MEK insoluble matter [%] | 99 | 99 | 99 | 99.6 | 78 | 0 |
| | Elastic modulus [MPa] | 1.4 | 1.5 | 1.2 | 1.5 | 2.2 | 1.6 |
| | Elongation at break [%] | 900 | 520 | 970 | 680 | 900 | 1100 |
| | Permanent elongation [%] | 39.8 | 30.5 | 58.8 | 43.5 | break | break |
| | Volume resistivity [Ω cm] | $2.1 \times 10^0$ | $4.5 \times 10^0$ | $3.2 \times 10^0$ | $5.2 \times 10^0$ | $6.6 \times 10^0$ | $6.3 \times 10^0$ |
| | Volume resistivity of object to which conductive crosslinked body is to be adhered [Ω cm] | $1.7 \times 10^{12}$ | $2.5 \times 10^{12}$ | $1.4 \times 10^{12}$ | $1.4 \times 10^{12}$ | $2.6 \times 10^{11}$ | $8.8 \times 10^{11}$ |
| | Leak current in object to which conductive crosslinked body is to be adhered [mA] | 0.002 | 0.002 | 0.004 | 0.003 | 0.028 | 0.010 |

(parts by mass)

With respect to the produced conductive crosslinked body and conductive material (hereinafter, called accordingly "conductive crosslinked body and the like"), crosslinking properties, conductivity, tensile properties, permanent elongation, and influence on the object to which the conductive crosslinked body adheres were evaluated. Hereinafter, an evaluation method and an evaluation result for each evaluation item are described.

<Evaluation Method>

[Crosslinking Property]

First, 1 g of test piece prepared from the conductive crosslinked body and the like was immersed in 30 g of MEK. The test piece in MEK was left stand still at room temperature for 4 hours and the test piece was then taken out and dried. Then, the mass of the test piece after drying was measured to calculate the ratio of the mass after drying relative to the initial mass (MEK insoluble matter).

[Tensile Property]

The elastic modulus of the conductive crosslinked body and the like was calculated from a stress-elongation curve in a tensile test according to JIS K7127 (1999). The test piece was prepared in a shape of test piece type 2. The elongation at break of the conductive crosslinked body and the like was measured according to JIS K 6251 (2004). As the test piece, a No. 5 dumbbell test piece was used.

[Permanent Elongation]

First, from the conductive crosslinked body and the like, a strip test piece having a width of 10 mm was prepared. Next, bench marks with an interval of 30 mm were put on the test piece such that the midpoint between the bench marks coincides with the center of the test piece. Then, while holding both ends of the test piece with a jig (holding interval of 40 nm), the test piece was stretched so that the distance between the bench marks became 60 mm (elongation rate 100%). In such a state, the test piece was put in an oven of 60° C. and was left stand still for 24 hours. Then, the test piece was taken out of the oven and the jig was removed, followed by leaving the test piece stand still at room temperature for 30 minutes. Subsequently, the distance between bench marks was measured. Then, the permanent elongation was calculated according to equation (I):

$$\text{Permanent elongation (\%)} = (d-30)/30 \times 100 \quad \text{(I)}$$

[d: distance between bench marks after test piece naturally contracted]

[Conductivity]

The volume resistivity of the conductive crosslinked body and the like was measured according to a parallel terminal electrode method of JIS K6271 (2008). At this time, as an insulating resin supporter for supporting the conductive crosslinked body and the like (test piece), a commercially available butyl rubber sheet (manufactured by Tigers Polymer Corporation) was used.

[Influence on Object to Which the Conductive Crosslinked Body Adheres]

In the manner described below, an object to which the conductive crosslinked body adheres was prepared. First, 100 parts by mass of an acrylonitrile butadiene rubber polymer (manufactured by Zeon Corporation, "Nipol DN202") was blended with 10 parts by mass of silica (manufactured by Tosoh Silica Corporation, "Nipsil (registered trade mark) VN3") and the resultant mixture was kneaded by a twin roll. Subsequently, to the resultant mixture, 10 parts by mass of a crosslinker (manufactured by NOF Corporation, "PERCUMYL (registered trade mark) D-40") was added and the resultant mixture was kneaded to prepare a rubber composition. Then, the prepared rubber composition was subjected to a press-crosslinking at 170° C. for about 15 minutes. Then, a secondary crosslinking was further performed by maintaining the rubber composition in an oven at 150° C. for 4 hours. In this manner, a thin film object (film thickness: about 100 μm) to which the conductive crosslinked body adheres was prepared. The volume resistance value of the prepared object to which the conductive crosslinked body adheres was measured and was found to be $2.7 \times 10^{12}$ Ωcm.

(1) Measurement of Volume Resistivity

First, from the conductive crosslinked body and the like, two circular test pieces with a diameter of about 20 mm and a thickness of about 30 μm were prepared. Next, each of these test pieces was arranged individually on the front and back surfaces of the object to which the conductive crosslinked body adheres, so as to prepare a test element. Here, the test pieces were arranged so as to face each other via the object to which the conductive crosslinked body adheres. Then, for accelerating the movement of impurities from the test piece to the object to which the conductive crosslinked body adheres, the test element was put in an oven of 150° C. and was left stand still for 1 hour. The test element was taken out of the oven and was left to reach room temperature. To the test element, then, a voltage of 100 V was applied using the pair of test pieces as electrodes. Then, the volume resistivity of the object to which the conductive crosslinked body adheres was measured.

(2) Measurement of Leak Current

Figure 6:
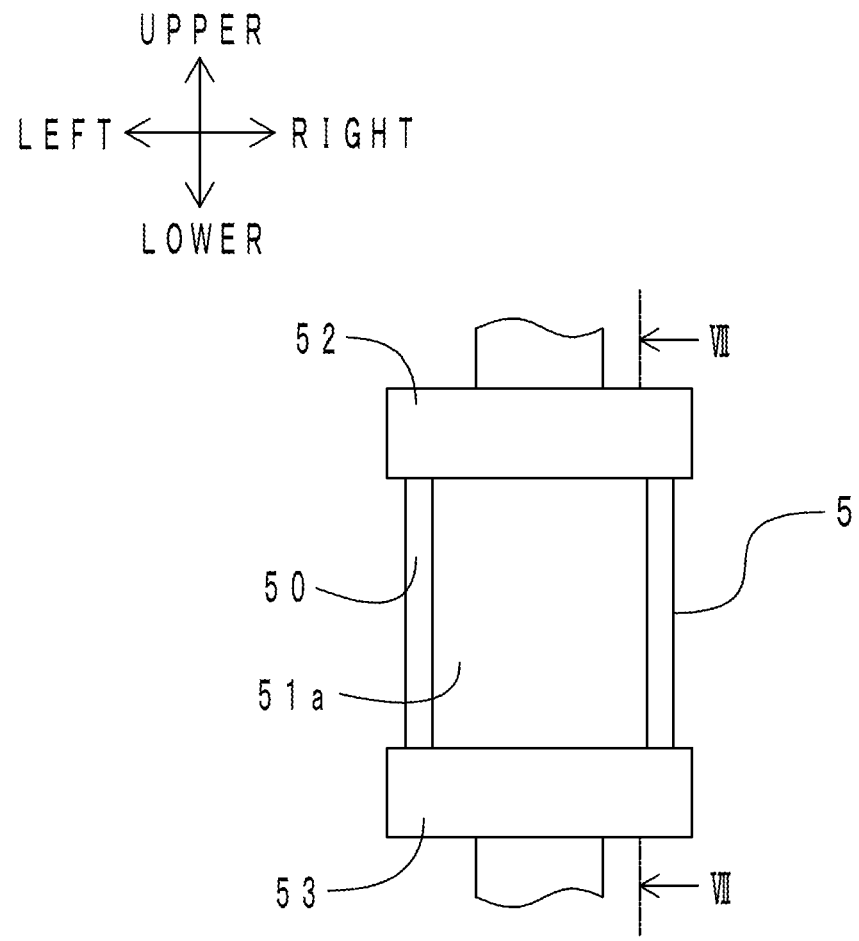
FIG. 6 is a front side elevation view showing a test element fitted in a testing apparatus.
Figure 7:
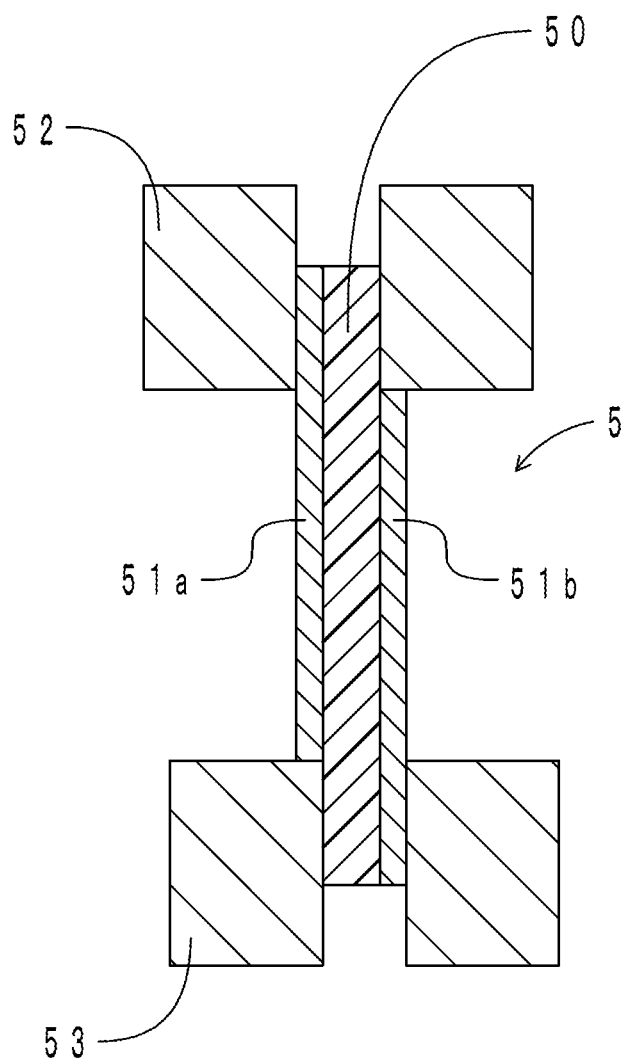
FIG. 7 is a VII-VII cross-sectional view of FIG. 6.

First, from the conductive crosslinked body and the like, two rectangular test pieces with a length of 38 mm, a width of 20 mm, and a thickness of about 10 μm were prepared. Next, each of these test pieces was arranged individually on the front and back surfaces of a rectangular object with a length of 50 mm, a width of 25 mm, and a thickness of about 100 μm, to which the conductive crosslinked body adheres, so as to prepare a test element. Then, the prepared test element was fitted in a testing apparatus, and a current that passed through the object when a voltage was applied using the pair of the test pieces as electrodes was measured. FIG. 6 shows a front side elevation view of the test element fitted in a testing apparatus. FIG. 7 shows a VII-VII cross-sectional view of FIG. 6.

As shown in FIG. 6 and FIG. 7, an upper end of a test element 5 is held by an upper chuck 52 of the testing apparatus, while a lower end of the test element 5 is held by a lower chuck 53. The test element 5 is mounted between the upper chuck 52 and the lower chuck 53 with the film stretched in the upper-lower direction (stretching rate: 25%).

The test element 5 includes an object 50 to which the conductive crosslinked body adheres and a pair of test pieces 51a, 51b. The test pieces 51a, 51b are arranged so as to face each other in the front-back direction with the object 50 being sandwiched therebetween. The test pieces 51a, 51b are arranged such that they are offset by 8 mm in the upper-lower direction. Namely, the test pieces 51a, 51b overlap with each other via the object 50 over an area of 30 mm length and 20 mm width. A wire (not shown) is connected to a lower end of the test piece 51a. Similarly, a wire (not shown) is connected to an upper end of the test piece 51b. The test pieces 51a, 51b are connected to a power source (not shown) through the wires.

When a voltage is applied between the test pieces 51a, 51b, electrostatic attractive force is generated between the test pieces 51a, 51b so that the object 50 is compressed. As a result, the thickness of the object 50 decreases and the object 50 stretches in the stretching direction (upper-lower direction). 10 seconds after a direct current voltage having a field intensity of 20 V/μm was applied to the object 50, a current passing through the object 50 was measured.

<Evaluation Result>

The evaluation results of the conductive crosslinked body and the like are summarized in Table 1 above. As shown in Table 1, the content of MEK insoluble matter in each conductive crosslinked body of Examples was nearly 100%. Thus, it was confirmed that the crosslinking satisfactorily progressed in each conductive crosslinked body of Examples. On the contrary, the content of MEK insoluble matter in the conductive material of Comparative Example 1 was 78%. Namely, it is apparent that in the conductive material of Comparative Example 1, the crosslinking did not progress in comparison with each conductive crosslinked body of Examples. Note that the conductive material of Comparative Example 2 was not subjected to crosslinking, so that the content of MEK insoluble matter was 0%.

With respect to the elastic modulus, there was no large difference between Examples and Comparative Examples. Also, with respect to the elongation at break, Examples 2 and 4 showed values slightly lower than those in Comparative Examples; however, Examples 1 and 3 showed values at substantially the same level as that in Comparative Examples. Each of the conductive crosslinked bodies of Examples exhibited high conductivity as with the conductive materials of Comparative Examples.

On the other hand, with respect to the permanent elongation, there was a large difference between Examples and Comparative Examples. Namely, while the conductive materials of Comparative Examples were broken when they are stretched at 60° C., the conductive crosslinked bodies of Examples were not broken. Thus, it was confirmed that the conductive crosslinked bodies of Examples did not easily lose their resilience and were excellent in shape retention.

Moreover, as a result of the test using the test element, when the conductive materials of Comparative Examples were used as an electrode, the volume resistivity of the object to which the conductive crosslinked body adheres decreased. In addition, in comparison with the case where the conductive crosslinked bodies of Examples were used as an electrode, the current that passed through the object to which the conductive crosslinked body adheres was larger. It is considered that this is because reaction residues derived from the elastomer and the crosslinking accelerator moved to the object to which the conductive crosslinked body adheres. On the contrary, when the conductive crosslinked bodies of Examples were used as an electrode, the volume resistivity of the object to which the conductive crosslinked body adheres hardly changed. In addition, the current that passed through the object to which the conductive crosslinked body adheres was small. Thus, it was confirmed that with the conductive crosslinked bodies of Examples, the reaction residue was not readily generated, or even when the reaction residue was generated, an influence on the object to which the conductive crosslinked body adheres was small.

INDUSTRIAL APPLICABILITY

A flexible actuator is used for, for example, artificial muscles for an industrial, medical, or welfare robot, a small-sized pump for cooling electronic parts or a small-sized pump for medical care, medical instruments, and the like. The conductive crosslinked body of the present invention is suitable for an electrode, a wire, or the like of such a flexible actuator. The conductive crosslinked body of the present invention is also suitable for an electrode, a wire, or the like of an elastomer sensor such as a capacitive sensor. The conductive crosslinked body of the present invention is suitable also for an electrode, a wire, or the like of, besides a power generation element, a flexible transducer for light emission, heat generation, color development, and the like. The conductive crosslinked body of the present invention is also suitable for an electrode, a wire, or the like of a flexible wiring board that is used for controlling a movable part of a robot or an industrial machine, a wearable device, a bendable display, and the like. Furthermore, the conductive crosslinked body of the present invention is also suitable as an electromagnetic wave shield.

The invention claimed is:

1. A conductive crosslinked body used for a transducer including an elastomer dielectric film, a plurality of electrodes that are arranged via the dielectric film, and a wire connected with each of the plurality of electrodes, at least one of the electrodes and the wire being formed of the conductive crosslinked body, characterized by being synthesized from a conductive composition containing a rubber polymer having a functional group capable of reacting with active hydrogen or a nucleophilic substituent having active hydrogen, an organic metal compound, and an electrically conducting agent, wherein a content of the electrically conducting agent is 0.1 vol % or more and 35 vol % or less per 100 vol % of a volume of the conductive crosslinked body, and the conductive crosslinked body has a crosslinked structure and is expandable/contractible.

2. The conductive crosslinked body according to claim 1, wherein the organic metal compound is one or more type(s) selected from a metal alkoxide compound, a metal acylate compound, and a metal chelate compound.

3. The conductive crosslinked body according to claim 1 or 2, wherein the organic metal compound contains one or more type(s) of elements selected from silicon, titanium, zirconium, hafnium, aluminum, gallium, magnesium, zinc, and boron.

4. The conductive crosslinked body according to claim 1 or 2, wherein the crosslinked structure is formed by a reaction of the functional group of the rubber polymer with the organic metal compound.

5. The conductive crosslinked body according to claim 4, wherein the functional group is one or more type(s) selected from a carboxy group, a hydroxy group, an amino group, and an epoxy group.

6. The conductive crosslinked body according to claim 5, wherein the conducting agent contains carbon black.

7. A production process of the conductive crosslinked body as claimed in claim 1, characterized by comprising:

a mixed solution preparing step for preparing a mixed solution in which the rubber polymer, the conducting agent, and the organic metal compound are mixed in a solvent that is capable of dissolving the rubber polymer and capable of chelating the organic metal compound; and a crosslinking step for removing the solvent from the mixed solution so as to allow a crosslinking reaction to proceed.

8. A transducer characterized by comprising:

an elastomer dielectric film;

a plurality of electrodes that is arranged via the dielectric film; and a wire that is connected with each of the plurality of electrodes, wherein at least one of the electrodes and the wire is formed of the conductive crosslinked body as claimed in claim 1.

9. The transducer according to claim 8, wherein the transducer is an actuator in which the dielectric film expands and contracts in accordance with a voltage applied between the plurality of electrodes.

* * * * *